(12) United States Patent
Abu Rahma et al.

(10) Patent No.: US 8,223,567 B2
(45) Date of Patent: Jul. 17, 2012

(54) MEMORY READ STABILITY USING SELECTIVE PRECHARGE

(75) Inventors: Mohamed H. Abu Rahma, San Diego, CA (US); Ritu Chaba, San Diego, CA (US); Nan Chen, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 434 days.

(21) Appl. No.: 12/334,817

(22) Filed: Dec. 15, 2008

(65) Prior Publication Data

US 2009/0154274 A1    Jun. 18, 2009

Related U.S. Application Data

(60) Provisional application No. 61/014,038, filed on Dec. 15, 2007.

(51) Int. Cl.
G11C 7/00 (2006.01)
(52) U.S. Cl. .......................................... 365/203; 365/206
(58) Field of Classification Search .................. 365/203, 365/206
See application file for complete search history.

(56) References Cited

U.S. PATENT DOCUMENTS

| | | | |
|---|---|---|---|
| 6,282,137 B1 | 8/2001 | Lee et al. | |
| 6,600,688 B2 | 7/2003 | Kawabata | |
| 6,608,788 B2 | 8/2003 | Ma et al. | |
| 6,982,899 B2 | 1/2006 | Sumitani et al. | |
| 7,009,886 B1 * | 3/2006 | Berger et al. | 365/185.25 |
| 2002/0097622 A1 | 7/2002 | Kawabata | |
| 2004/0141362 A1 | 7/2004 | Sumitani et al. | |
| 2004/0252572 A1 | 12/2004 | Becker | |
| 2007/0195616 A1 | 8/2007 | Fallah et al. | |
| 2010/0103755 A1 * | 4/2010 | Chen et al. | 365/203 |

FOREIGN PATENT DOCUMENTS

RU    2060564 C1    5/1996

OTHER PUBLICATIONS

International Search Report—PCT/US08/086829, International Search Authority—European Patent Office—Apr. 6, 2009.
Written Opinion—PCT/US/08/086829, International Search Authority—European Patent Office—Apr. 6, 2009.

* cited by examiner

*Primary Examiner* — Son Dinh
*Assistant Examiner* — Hien Nguyen
(74) *Attorney, Agent, or Firm* — Sam Talpalatsky; Nicholas J. Pauley; Jonathan T. Velasco

(57) ABSTRACT

A memory device utilizes selective precharge and charge sharing to reduce a bit line voltage before accessing a bit cell. A reduction in bit line voltage is achieved by precharging different sections of the bit line to different voltages (e.g., a supply voltage and ground) and using charge sharing between these sections. Read stability improves as a result of the reduction of bit line voltage. The relative capacitance difference between bit line sections determines the bit line voltage after charge sharing. Thus, the memory device is tolerant to process or temperature variations. The bit line voltage may be controlled in design by selecting the sections that are precharged to supply voltage or ground.

14 Claims, 10 Drawing Sheets

MEMORY READ STABILITY USING SELECTIVE PRECHARGE

CROSS REFERENCE TO RELATED APPLICATION

This application claims the benefit of U.S. Provisional Application. No. 61/014,038 filed Dec. 15, 2007.

TECHNICAL FIELD

This disclosure generally relates to integrated circuits (ICs). More specifically, this disclosure relates to memory devices.

BACKGROUND

A memory device or memory can generally be described as hardware that can store data for later retrieval. Some memory devices include a set of transistors used to store data (represented, for example, by an electrical charge) and a set of transistors used to control access to the data store. Sizes of transistors have shrunk to 45 nm and will soon reach 32 nm. As sizes have decreased, the margin of errors acceptable during manufacturing have decreased. As a result, the manufactured transistors exhibit larger variability during operation.

The large increase in variability of transistor technologies has negatively affected memory devices and their read stability. Read stability is the ability of the memory device to retain the correct data when accessed in the presence of noise. Commonly, read stability is measured using static noise margin (SNM). Large variations in manufactured transistors cause a reduction in the memory device's static noise margin. This reduction in static noise margin lowers the bit cell robustness and tolerance against noise, and hence, lowers memory yield due to increased failures.

Slightly reducing a memory device's bit line voltage compared to the supply voltage significantly improves the memory device's static noise margin. However, in memory designs the bit line is generally precharged to a supply voltage before accessing the memory. There have been several attempts to reduce the bit line voltage to improve read stability. Previous attempts have shown large sensitivity to process, temperature and voltage variations during manufacturing that may limit their effectiveness to improve read stability. Some of these attempts include the pulsed bit line scheme, dual supply voltages, and dynamic cell biasing.

In a pulsed bit line scheme, a pull down device is connected to the bit line. After precharging the bit line to the supply voltage, a narrow pulse is applied on the pull down device that lowers the bit line voltage and improves read stability. This technique is very sensitive to the generation of this narrow pulse, especially because the pulse width will vary with process, voltage, and temperature variations during manufacturing of the transistors and environmental variations.

Another attempt uses two supply voltages, one for the bit cell, and another for the bit line, where the bit line voltage is lower than the bit cell voltage. Adding additional supply voltages is a difficult task and complicates the physical design and verification of the chip.

Yet another attempt to reduce bit line voltage includes using an NMOS device to precharge the bit line to reduce the bit line voltage by the threshold voltage of the NMOS device. A low threshold voltage NMOS device is used in this case, which increases process complexity and cost, e.g., requiring additional masks. In addition, the threshold voltage has strong dependence on process, voltage, and temperature variations.

These three attempts to improve memory read stability are sensitive to manufacturing variations and as such are difficult to implement and are costly to implement. Such cost is further increased when multiple supply voltages or an NMOS device is implemented in the precharge circuitry. Thus, there is a need for an improved read stability in memory designs that decrease sensitivity to manufacturing variations without incurring additional cost.

BRIEF SUMMARY

In accordance with one aspect of this disclosure, a memory device includes a bit line having a first section and a second section. The memory device also include a charge-sharing circuit selectively coupled to the first section and the second section, in which the charge-sharing circuit is configured to couple and decouple the first section to the second section.

In accordance with another aspect of this disclosure, a method of operating of a memory device includes precharging a first section of a bit line to a first voltage and precharging a second section of the bit line to a second voltage. The second voltage is different than the first voltage. The method also includes sharing charge between the first section of the bit line and the second section of the bit line.

In accordance with yet another aspect of this disclosure, a memory device includes means for precharging a first section of a bit line to a first voltage. The memory device also includes means for precharging a second section of the bit line to a second voltage. The memory device further includes means for sharing charge between the first section of the bit line and the second section of the bit line.

In accordance with a further aspect of the disclosure, a method of operating a memory device having a bit line including a first section and a second section includes the step of precharging a first section of a bit line to a first voltage. The method further includes the step of precharging the second section of the bit line to a second voltage, which differs from the first voltage. The method also includes the step of sharing charge between the first section of the bit line and the second section of the bit line to obtain a voltage level between the first voltage and second voltage.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the disclosure in the present application, reference is now made to the following descriptions taken in conjunction with the accompanying drawings.

DETAILED DESCRIPTION

Figure 1:
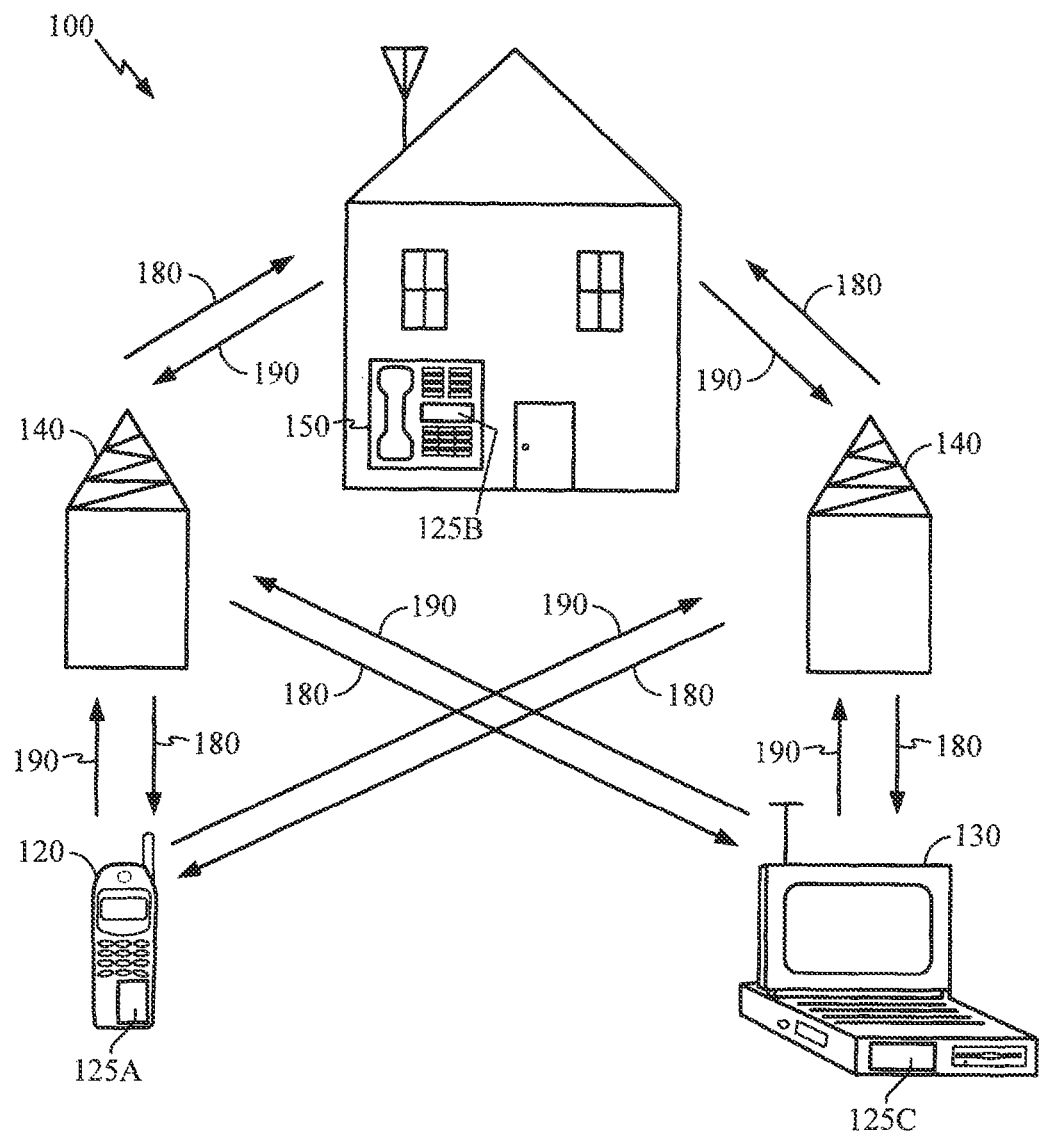
FIG. 1 is an illustration of an exemplary wireless communication system in which an embodiment of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include memory devices 125A, 125B and 125C, created according to an embodiment of the disclosure. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. The disclosure may be suitably employed in any device which includes memory devices fabricated in accordance with the teachings of the disclosure.

Figure 2A:
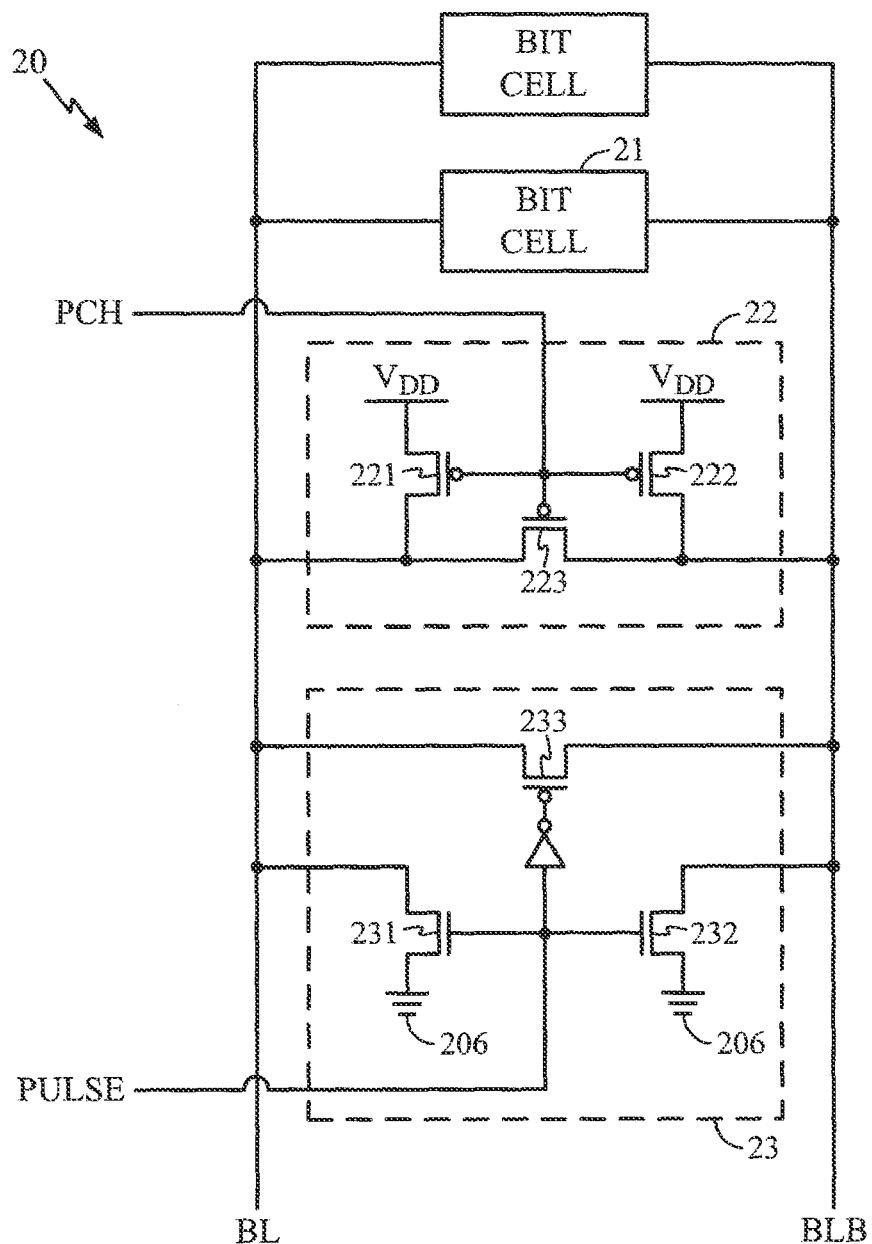
FIG. 2A is a circuit schematic illustrating a conventional pulsed bit line scheme for improved SRAM stability.

FIG. 2A is a circuit schematic illustrating a conventional pulsed bit line scheme for improved memory stability. A circuit 20 includes a bit cell 21 configured to store data and is coupled to additional circuitry to control the read and write behavior of the circuit 20. The bit cell 21 may be a six transistor storage cell. A precharge signal, PCH, is coupled to a precharge circuit 22. The precharge circuit 22 includes a transistor 221 coupled to a bit line, BL, a transistor 222 coupled to an inverse bit line, BLB, and a transistor 223 coupled to both the bit line, BL, and the inverse bit line, BLB. A pulse signal, PULSE, is coupled to a pull-down circuit 23. The pull-down circuit 23 includes a transistor 231 coupled to the bit line, BL, a transistor 232 coupled to the inverse bit line, BLB, and a transistor 233 coupled to both the bit line, BL, and the inverse bit line, BLB.

Figure 2B:
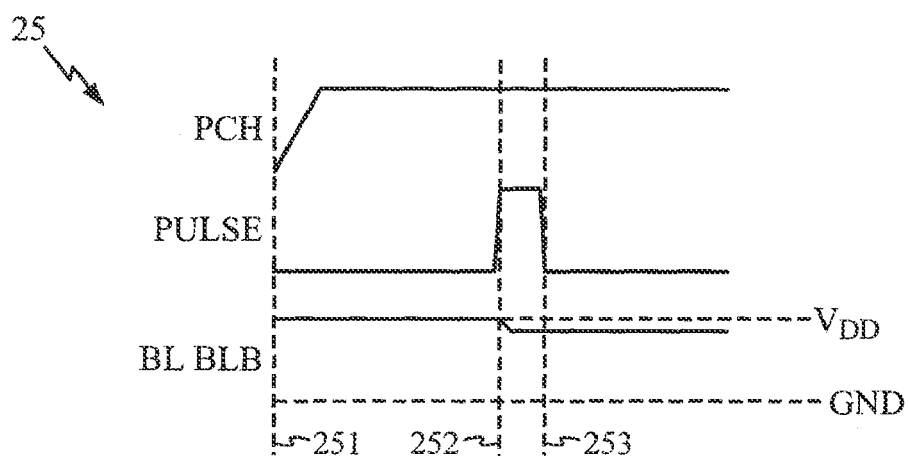
FIG. 2B is a timing diagram illustrating a conventional pulsed bit line scheme for improved SRAM stability.

For illustrative purposes, operation of the conventional pulsed bit line scheme will now be described. FIG. 2B is a timing diagram illustrating a conventional pulsed bit line scheme for improved memory stability. The circuit 20 starts at a time 251 when the precharge signal, PCH, is low and the transistor 221 pulls up the bit line, BL, to a supply voltage, $V_{DD}$, and the transistor 222 pulls up the inverse bit line, BLB, to the supply voltage, $V_{DD}$. At a time 252 the precharge signal, PCH, is high turning off the transistor 221, the transistor 222, and the transistor 223 to disconnect the bit line, BL, and the inverse bit line, BLB, from the supply voltage, $V_{DD}$. At time 252 a narrow positive pulse is generated on the pulse signal, PULSE. The pulse signal, PULSE, switches on the transistor 231 and the transistor 232 to couple the bit line, BL, and the inverse bit line, BLB, to a ground 206. The transistor 233 switches off to disconnect the bit line, BL, from the inverse bit line, BLB. A reduction of voltage occurs on the bit line, BL, and the inverse bit line, BLB. At a time 253, the pulse signal, PULSE, returns to low so the bit line, BL, and the inverse bit line, BLB, stop reducing voltage. Although this technique reduces the bit line voltage to improve read stability, this technique is very sensitive to the generation of the narrow pulse, especially because the pulse width will vary strongly with process, voltage, and temperature variations during manufacturing of the transistors.

Figure 3:
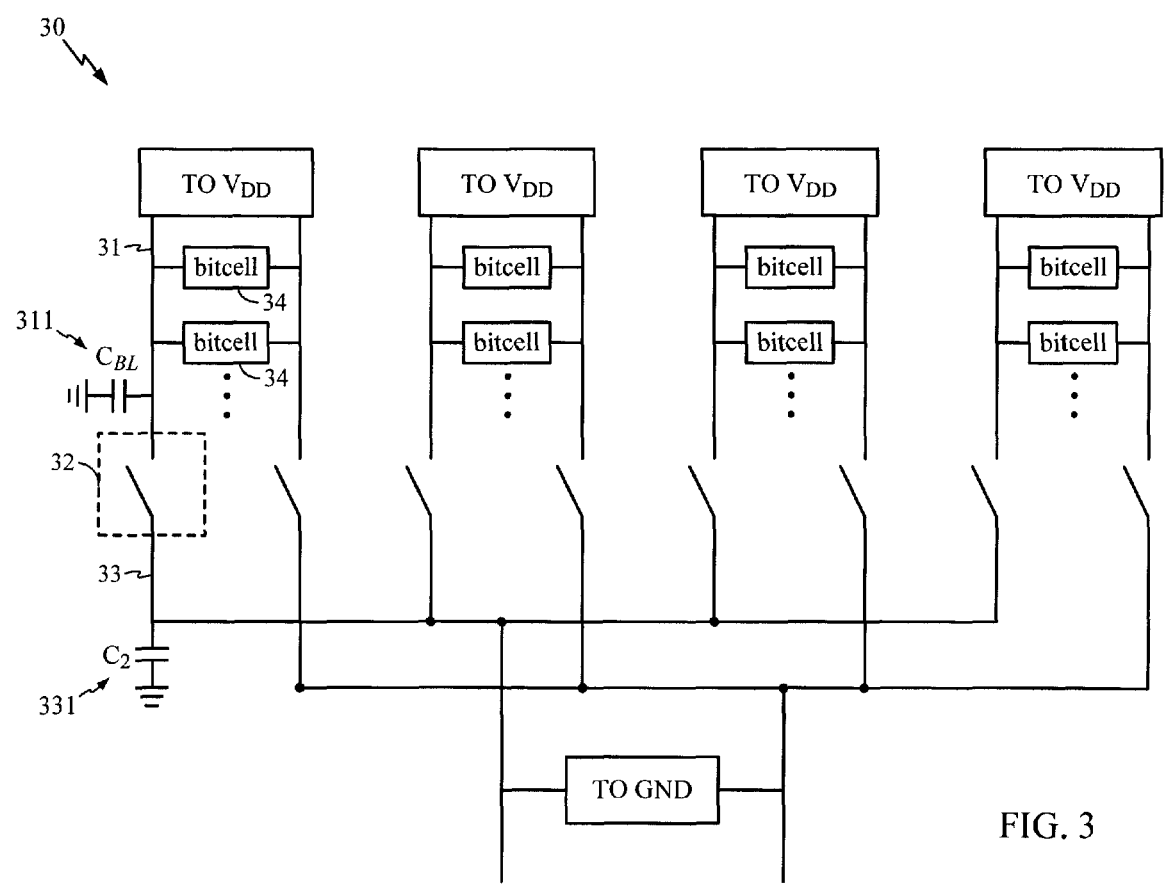
FIG. 3 is a circuit diagram illustrating initial precharge operation in the exemplary selective precharge technique according to one embodiment of the disclosure.
Figure 4:
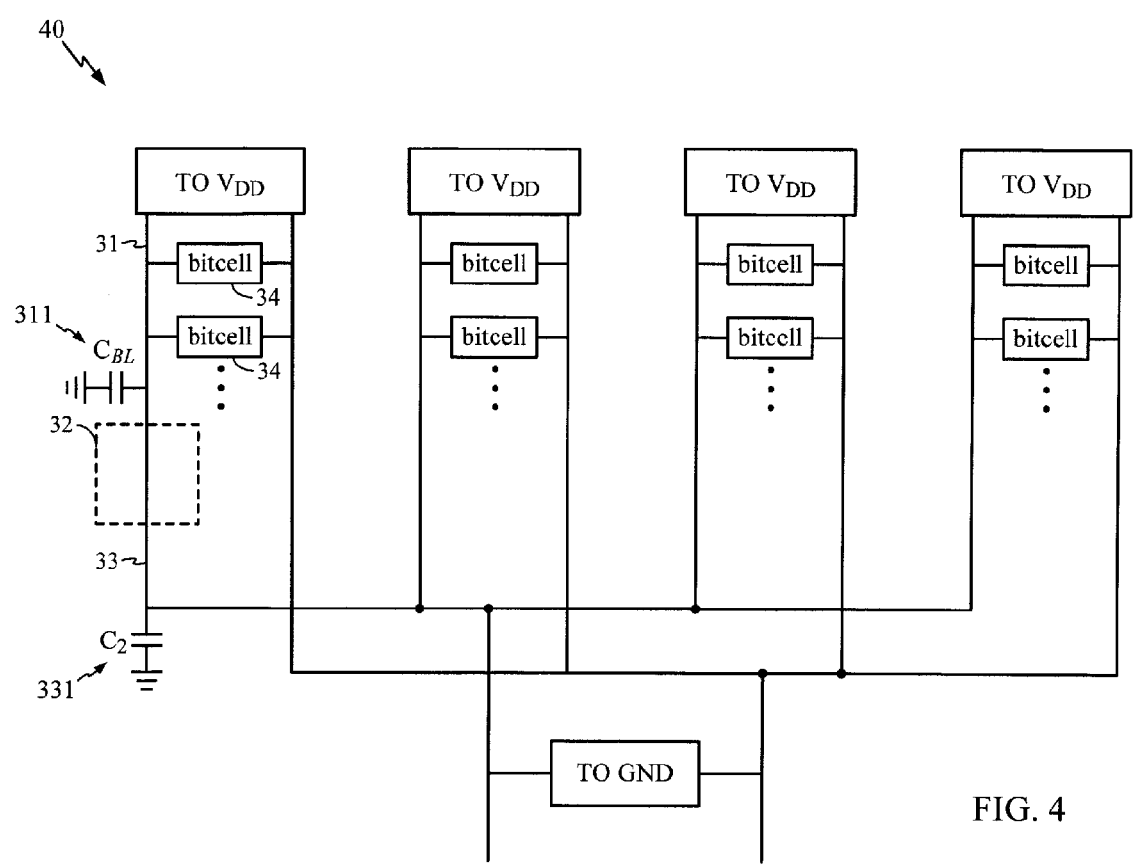
FIG. 4 is a circuit diagram illustrating charge sharing operation in the exemplary selective precharge technique according to one embodiment of the disclosure.
Figure 5:
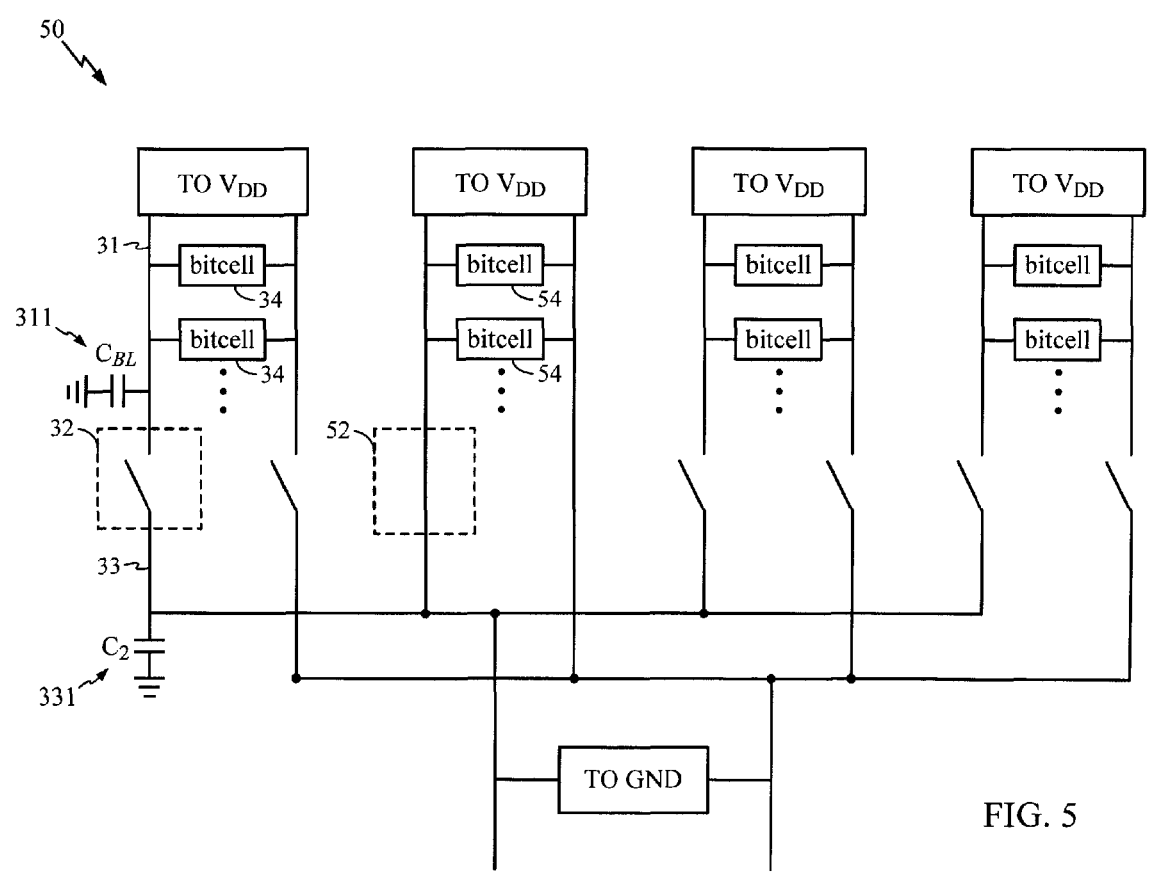
FIG. 5 is a circuit diagram illustrating selection of a bit cell for a read or write operation according to one embodiment of the disclosure.

Referring now to FIG. 3, FIG. 4, and FIG. 5, an exemplary improved selective precharge technique will now be described. The selective precharge technique reduces the bit line voltage to improve read stability without being as sensitive to process, voltage, and temperature variations. The bit line voltage is reduced by sharing charge between sections of the bit line that are selectively coupled to enable sharing during the read and write operations. Although SRAM memory devices will be described, the selective precharge technique can be applied to any memory design including, but not limited to, SRAM, DRAM, or MRAM.

Different parts of the bit line are precharged to different voltages (for example, $V_{DD}$ and GND) and by using charge sharing, the required final value of the bit line voltage is achieved. In one embodiment, the charge sharing operation is divided into three parts. First, as illustrated in FIG. 3, the upper part of the bit line is precharged to $V_{DD}$ while the lower part of the bit line is precharged to GND. Next, as, illustrated in FIG. 4, the charge sharing switches are turned on to enable charge sharing between the upper of lower parts of the bit lines. Therefore, the final bit line voltage will be determined by the ratio of capacitance between $C_{BL}$ and $C_2$. Finally, as illustrated by FIG. 5, charge sharing is disabled for all columns, while the switch remains on for a column selected for a read or write operation.

FIG. 3 is a block diagram illustrating initial precharge operation in the exemplary selective precharge technique. A block diagram 30 includes an upper bit line 31 along with associated capacitance illustrated by a capacitor 311, with value $C_{BL}$. A lower bit line 33 has associated capacitance illustrated by a capacitor 331, with value $C_2$. The upper bit line 31 and the lower bit line 33 are coupled to a mux switch 32. In the block diagram 30, the mux switch 32 is open during initial precharge to allow the upper bit line 31 to precharge to a supply voltage, $V_{DD}$, and the lower bit line 33 to precharge to a ground, GND. Additionally, bit cells 34 are coupled to the upper bit line 31. In another embodiment, the bit cells 34 may be coupled to the lower bit line 33.

FIG. 4 is a block diagram illustrating charge sharing operation in the exemplary selective precharge technique. A block diagram 40 includes the upper bit line 31, the capacitance represented by the capacitor 311, the lower bit line 33, the capacitance represented by the capacitor 331, and the mux switch 32. The charge sharing operation occurs by closing the mux switch 32 to couple the upper bit line 31 to the lower bit line 33. A final voltage, $V_{BL}$, on the combination of the upper bit line 31 and the lower bit line 33 is a function of the initial voltage on the upper bit line 31, the initial voltage on the lower bit line 33, the capacitor 311, and the capacitor 331 as given $$V_{BL} = \frac{V_{DD}*(N*C_{BL})}{N*C_{BL}+C_2} = \frac{V_{DD}}{1+1/N*C_2/C_{BL}},$$

where N is the number of bit line pairs connected to the mux switch 32.

FIG. 5 is a block diagram illustrating charge sharing disablement in the exemplary selective precharge technique. A block diagram 50 includes the upper bit line 31, the capacitance represented by the capacitor 311, the lower bit line 33, the capacitance represented by the capacitor 331, and the mux switch 32. The mux switch 32 opens to disconnect the upper bit line 31 from the lower bit line 33 after charge sharing has completed. This opening disables the charge sharing operation so data may be read from or written to the bit cell 34. A mux switch 52 remains closed because a bit cell 54 has been selected for a read or write operation.

Figure 6:
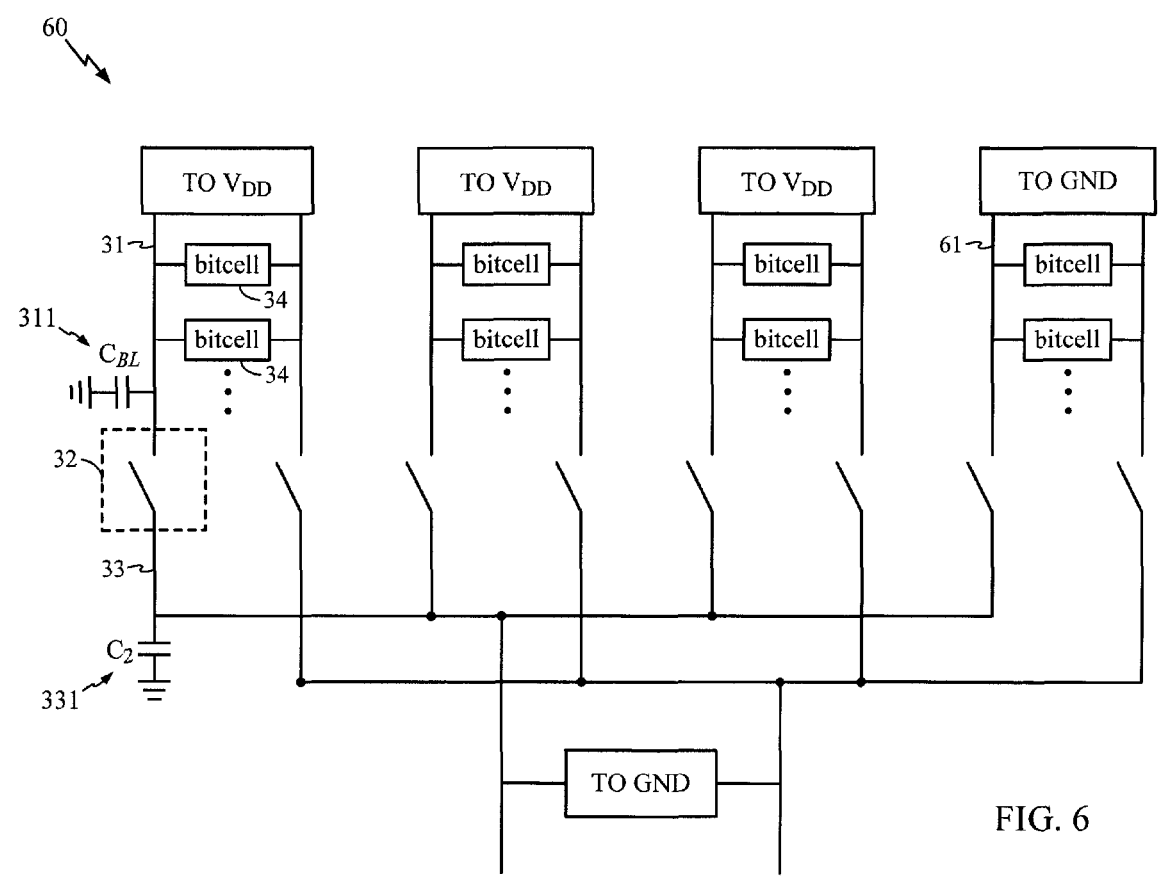
FIG. 6 is a circuit diagram illustrating precharge of bit lines to different voltages in the exemplary selective precharge technique according to one embodiment of the disclosure.

FIG. 6 is a block diagram illustrating precharge of bit lines to different voltages in the exemplary selective precharge technique according to another embodiment of the disclosure. In this embodiment, not all of the upper bit lines are charged to the supply voltage, $V_{DD}$. A block diagram 60 includes the upper bit line 31, the capacitance represented by the capacitor 311, the lower bit line 33, the capacitance represented by the capacitor 331, and the mux switch 32. The upper bit line 31 is precharged to the supply voltage, $V_{DD}$, and the lower bit line 33 is precharged to the ground, GND. In this embodiment, each upper bit line may be precharged to a different voltage. For example, an upper bit line 61 is precharged to the ground, GND. Thus, when charge sharing occurs, the upper bit lines and inverse upper bit lines will have a lower final voltage as compared to when all upper bit lines are precharged to the supply voltage, $V_{DD}$. Additional bit lines may be charged to the ground, GND, the supply voltage, $V_{DD}$, or other supply voltages (not shown) to obtain an appropriate final voltage.

Figure 7:
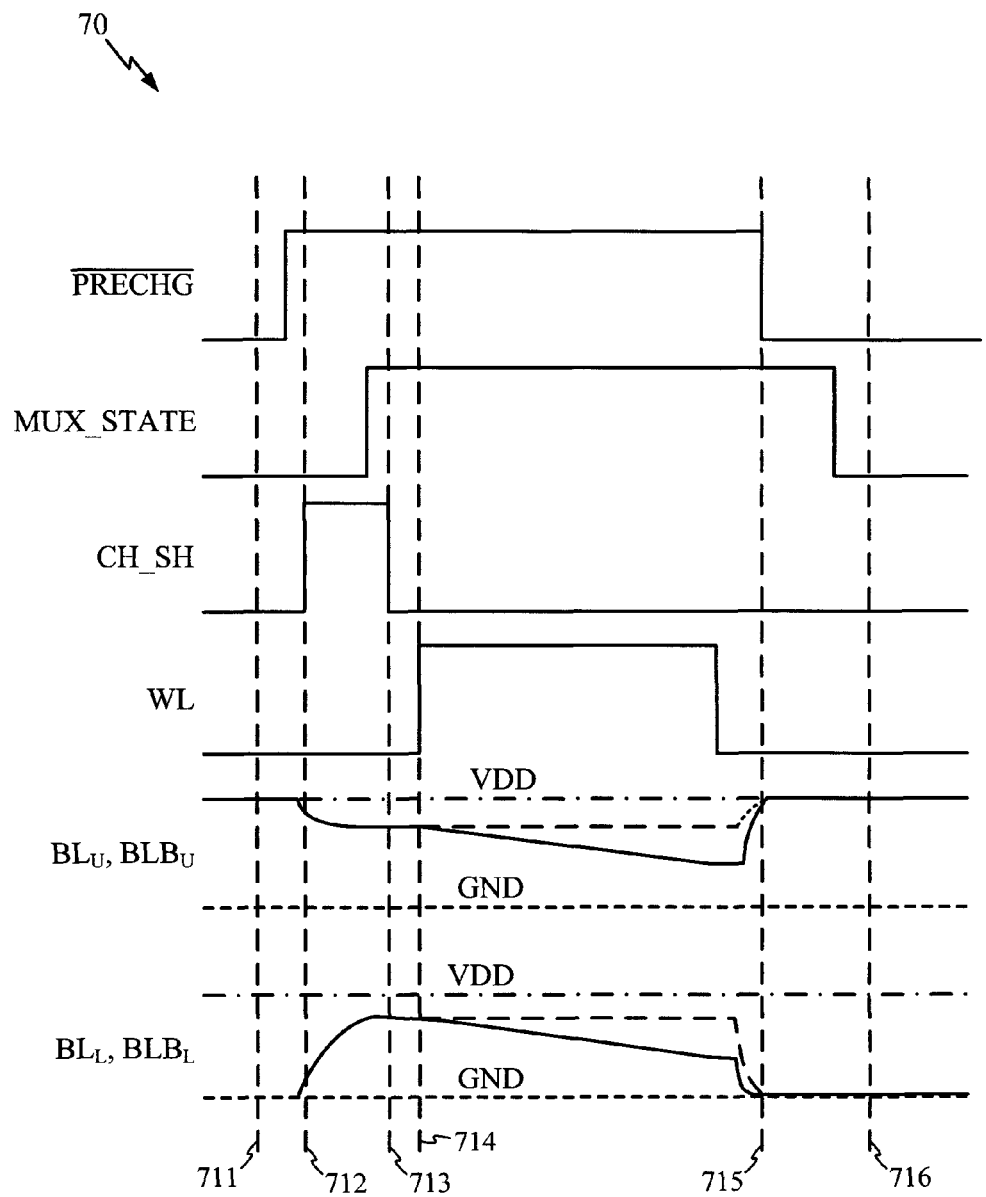
FIG. 7 is a timing diagram illustrating the exemplary selective precharge operation according to one embodiment of the disclosure.

FIG. 7 is a timing diagram illustrating selective precharge operation. Operation of selective precharge on an upper bit line, $BL_U$, an inverse upper bit line, $BLB_U$, a lower bit line, $BL_L$, and an inverse lower bit line, $BLB_L$, is controlled by a precharge signal, PRECHG, a mux signal, MUX_STATE, and a charge sharing signal, CH_SH. A word line signal, WL, enables access to the upper bit line, $BL_U$, inverse upper bit line, $BLB_U$, lower bit line, $BL_L$, and inverse lower bit line $BLB_L$. An initial state of the circuit is at a time 711 when the precharge signal, PRECHG, the mux signal, MUX_STATE, the charge sharing signal, CH_SH, and the word line, WL, are low. The lower bit line, $BL_L$, and the inverse lower bit line, $BLB_L$, are predischarged to ground, and the upper bit line, $BL_U$, and inverse upper bit line, $BLB_U$, are precharged to a supply voltage, $V_{DD}$. The supply voltage level is indicated by the dashed-dotted line.

After the precharge signal, PRECHG, went high (deactivating a precharge circuit), charge sharing is enabled when the mux signal, MUX_STATE, is low. As a result, at a time 712 the charge sharing signal, CH_SH, goes high. The upper bit line, $BL_U$, and inverse upper bit line, $BLB_U$, reduce in voltage towards a ground, GND, in response to the charge sharing. Additionally, the lower bit line, $BL_L$, and the inverse lower bit line, $BLB_L$, increase in voltage towards the supply voltage, $V_{DD}$. The mux signal, MUX_STATE, goes high shortly before a time 713 indicating the end of a charge share operation. As a result, the charge sharing signal, CH_SH, goes low at the time 713 completing the charge sharing operation. The upper bit line, $BL_U$, inverse upper bit line, $BLB_U$, lower bit line, $BL_L$, and inverse lower bit line, $BLB_L$, voltages stabilize at the time 713 when the charge sharing operation ends. The reductions in voltages of the upper bit line, $BL_U$, and inverse upper bit line, $BLB_U$, increase the read stability of the memory.

At a time 714 the word line, WL, goes high indicating a read operation has started. The voltage on the upper bit line, $BL_U$, the upper inverse bit line, $BLB_U$, the lower bit line, $BL_L$, and the lower inverse bit line, $BLB_L$, discharge towards the ground, GND. At a time 715 after the read operation has completed and the word line, WL, went low, the precharge signal, PRECHG, goes low. As a result, the upper bit line, $BL_U$, and inverse upper bit line, $BLB_U$, are precharged to the supply voltage, $V_{DD}$, and the lower bit line, $BL_L$, and inverse lower bit line, $BLB_L$, are predischarged to ground, GND. Shortly before a time 716, the mux signal, MUX_STATE, went low placing all signals back in their initial state at the time 716.

Figure 8:
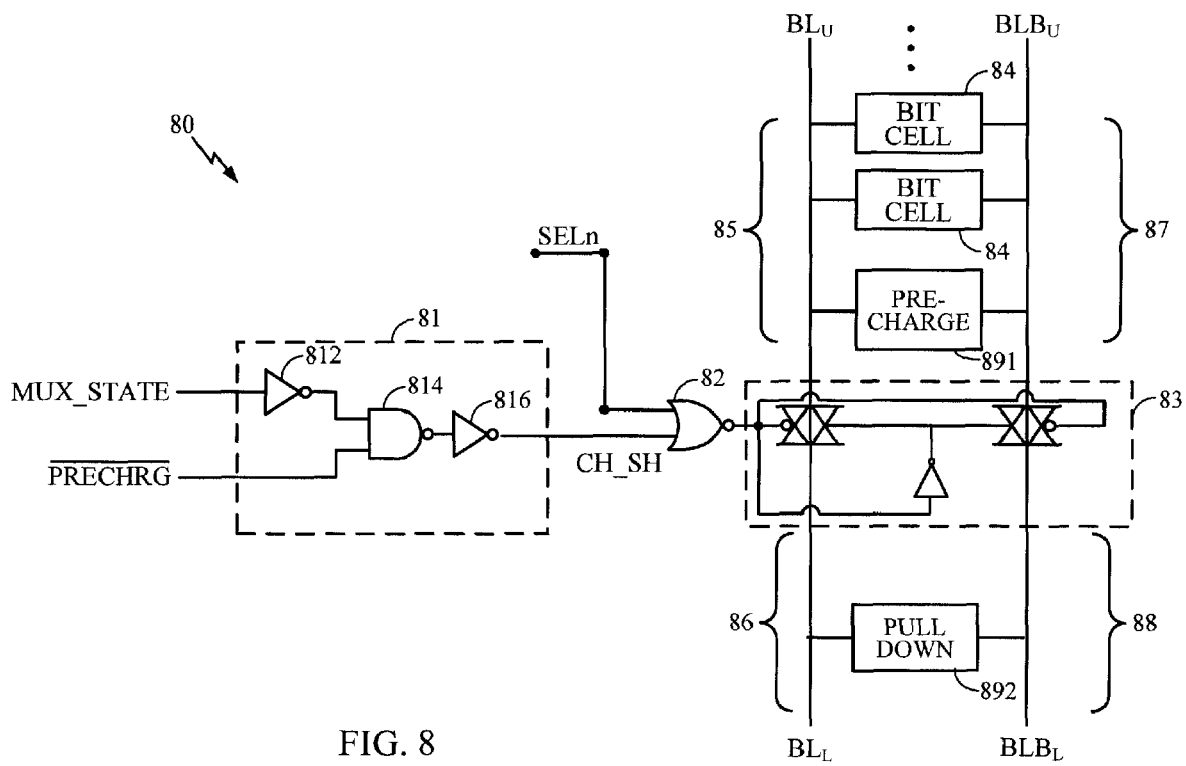
FIG. 8 is a circuit schematic of a circuit for implementing the exemplary selective precharge technique according to one embodiment of the disclosure.

FIG. 8 is a circuit schematic of a circuit for implementing the exemplary selective precharge technique according to one embodiment of the disclosure. A circuit 80 includes an upper bit line 85, $BL_U$, and an inverse upper bit line 87, $BLB_U$, configured to accessing bit cells 84. Additionally, the circuit 80 includes a lower bit line 86, $BL_L$, and an inverse lower bit line 88, $BLB_L$. Although the bit cells 84 are shown connected to the upper bit lines 85,87, the bit cells 84 could also be connected to the lower bit lines 86,88. A charge-sharing enable circuit 81 configured to activate charge sharing is coupled to the mux signal, MUX_STATE, and the precharge signal, PRECHRG, and outputs a charge sharing signal, CH_SH. The charge-sharing enable circuit 81 includes an inverter 812 coupled to the mux signal, MUX_STATE, a NAND gate 814 coupled to the output of the inverter 812 and the precharge signal, PRECHRG, and an inverter 816 coupled to the output of the NAND gate 814. The charge-sharing enable circuit 81 illustrated is only one possible combination of logic gates capable of activating charge sharing. A precharge circuit 891 is coupled to the upper bit lines 85,87 and a pull down circuit 892 is coupled to the lower bit lines 86,88. The precharge circuit 891 and the pull down circuit 892 may be controlled by the precharge signal, PRECHRG.

The charge sharing signal, CH_SH, and a select signal, SELn, are inputs to a NOR gate 82 for controlling a charge sharing circuit 83. The charge sharing circuit 83 is active when the charge sharing signal, CH_SH, is high. When the charge sharing circuit 83 is active, the upper bit line 85 is coupled to the lower bit line 86 and the upper bit line 87 is coupled to the lower bit line 88. The select signal, SELn, is used to select bit cells for read or write operations. Although only one select signal, SELn, upper bit line, $BL_U$, inverse upper bit line, $BLB_U$, lower bit line, $BL_L$, and inverse lower bit line, $BLB_L$, are shown, many more may be incorporated into the circuit 80. Additionally, many more bit cells may be incorporated into the circuit 80.

Operation of the circuit 80 will now be described in conjunction with the timing diagram 70. At the time 711 the precharge signal, PRECHG, is low and the mux signal, MUX_ STATE, is low. The output of the charge-sharing enable circuit 81, CH_SH, will be low. The upper bit lines 85,87 are precharged to the supply voltage, $V_{DD}$, and the lower bit lines 86,88 are precharged to the ground. At the time 712 after the precharge signal, PRECHG, goes high (deactivating the precharge circuitry) while the mux signal, MUX_ STATE, remains low, the output of the charge-sharing enable circuit 81, CH_SH, goes high. This causes the NOR gate 82 to control the charge sharing circuits 83 to couple the upper bit lines 85,87 to the lower bit lines 86,88 leading to a reduction of the voltage on the upper bit line, $BL_U$, and the inverse upper bit line, $BLB_U$. At the time 713, after the mux signal, MUX_ STATE, goes high, the output of the charge-sharing enable circuit 81, CH_SH, goes low. This change causes the charge sharing circuits 83 to decouple the upper bit lines 85,87 from the lower bit lines 86,88, ending charge sharing. At the time 714, the bit cells 84 are accessed (in response to the write line signal, WL) and a read or write operation occurs.

The charge sharing technique, as described by this disclosure, improves memory read stability by reducing the bit line voltage from the supply voltage. The bit line voltage is reduced by precharging one section of the bit line to a first voltage and a second section of the bit line to a second voltage. A charge sharing circuit them selectively couples the two sections to reach a bit line voltage between the first and second voltage. The final voltage is dependent, in part, on the relative capacitance of the two sections of the bit line, therefore any manufacturing variation in the devices does not affect the operation of the charge sharing. In one embodiment, the first section is the upper bit line and the second section is the lower bit line.

One advantage of this disclosure is improved read stability by reducing the bit line voltage. A precise voltage level may be chosen for the bit lines. As mentioned above, a reduction in the bit line voltage improves the static noise margin (SNM) of the memory device. Both accessed bit cells and half-selected bit cells are improved because all the bit lines see lower voltage compared to the bit cell's supply voltage. Half-selected bit cells are cells selected by an asserted word line but not selected by its bit lines.

A second advantage of this disclosure is superior design robustness. The disclosure does not depend on the threshold voltage of the transistor and timing of a critical signal.

A third advantage of this disclosure is process variation tolerance. The proposed solution depends on relative capacitance values that do not change with process, voltage, and temperature variation. Bit line voltage will be independent of the process conditions A fourth advantage of this disclosure is design flexibility. The bit line's voltage value may be changed by selecting which bit line segments to precharge to $V_{DD}$ and which bit line segments to precharge to ground. For example, precharging one bit line or more to ground can allow larger delta values (the change of the bit line from $V_{DD}$). For example, if the supply voltage is 1.125 Volts and the upper sections are 1.125 Volts and the lower sections are 1.125 Volts then the final voltage may be 1.125 Volts if all bit lines are precharged to $V_{DD}$. The delta would be 0 millivolts in this case. However, in the same case if one of the bit lines is predischarged to ground, then the final voltage would be 1.00 Volts. The delta would be 125 millivolts in this case. Therefore, there is a high degree of flexibility regarding the voltages that bit line sections may be precharged to.

A fifth advantage of this disclosure is that only one supply voltage is used. This simplifies the top level physical design and verification of the memory.

The memory device as disclosed may be coupled to a microprocessor or other microelectronic device. The memory device may be packaged with the microprocessor and further incorporated into a communications device. For example, the memory may be embedded in a mobile phone or a communications base station.

Figure 9:
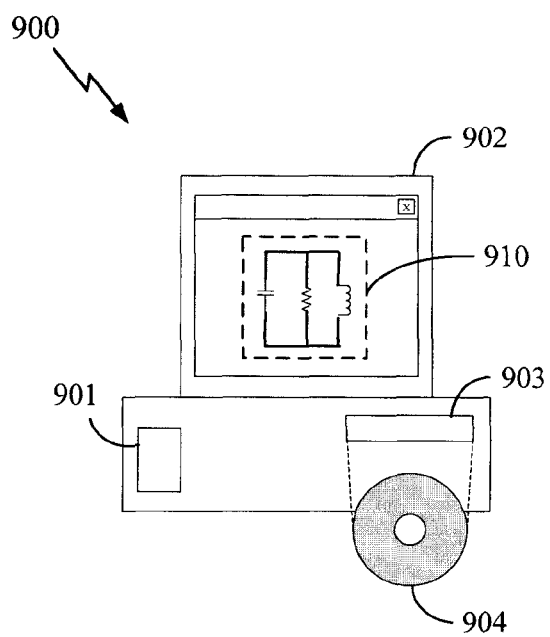
FIG. 9 is a block diagram illustrating a design workstation used for circuit, layout, and logic design of the disclosed semiconductor integrated circuit.

FIG. 9 is a block diagram illustrating a design workstation used for circuit, layout, and logic design of the disclosed semiconductor integrated circuit. A design workstation 900 includes a hard disk 901 containing operating system software, support files, and design software such as Cadence or OrCAD. The design workstation 900 also includes a display to facilitate design of a circuit design 910. The circuit design 910 may be the memory circuit as disclosed above. A storage medium 904 is provided for tangibly storing the circuit design 910. The circuit design 910 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 by decreasing the number of processes for designing semiconductor integrated circuits.

Although the present disclosure and its advantages have been described in detail, it should be understood that various changes, substitutions and alterations can be made herein without departing from the spirit and scope of the disclosure as defined by the appended claims. For example, although SRAM memory devices have been described, the selective precharge technique can be applied to any memory design including, but not limited to, SRAM, DRAM, or MRAM. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device comprising:
    a first bit line having a first section and a second section, the first section of the first bit line configured to be precharged to a first voltage, and the second section of the first bit line configured to be precharged to a second voltage different from the first voltage; and
    a charge-sharing circuit selectively coupled to the first section and the second section, in which the charge-sharing circuit is configured to couple and decouple the first section to the second section.

2. The memory device of claim 1, in which the first section of the first bit line is predischarged to ground and the second section of the first bit line is precharged to a supply voltage.

3. The memory device of claim 1, further comprising a second bit line having a first section and a second section, in which the first section of the second bit line and the second section of the second bit line are precharged to the first voltage.

4. The memory device of claim 1, further comprising a charge sharing enable circuit configured to activate the charge-sharing circuit when a precharge circuit is inactive and a mux signal indicates charge sharing.

5. The memory device of claim 1, further comprising a bit cell coupled to the first section of the first bit line.

6. The memory device of claim 1, further comprising an inverse bit line having a first section and a second section, in which the charge-sharing circuit is selectively coupled to the first section of the inverse bit line and the second section of the inverse bit line and is configured to couple and decouple the first section of the inverse bit line to the second section of the inverse bit line.

7. The memory device of claim 1, in which the memory device is coupled to a microprocessor.

8. The memory device of claim 7, in which the memory device and microprocessor are integrated into a communications device.

9. The memory device of claim 1, integrated into at least one of a mobile phone, a set top box, a music player, a video player, an entertainment unit, a navigation device, a computer, a hand-held personal communication systems (PCS) unit, a portable data unit, and a fixed location data unit.

10. A memory design structure tangibly embodied on a non-transitory computer readable medium, comprising:
a first bit line having a first section and a second section, the first section of the first bit line configured to be precharged to a first voltage, and the second section of the first bit line configured to be precharged to a second voltage different from the first voltage; and
a charge-sharing circuit selectively coupled to the first section and the second section, in which the charge-sharing circuit is configured to couple and decouple the first section to the second section.

11. The memory design structure of claim 10, further comprising a microprocessor coupled to the first bit line and the charge-sharing circuit.

12. The memory design structure of claim 10, integrated into at least one of a mobile phone, a set top box, a music player, a video player, an entertainment unit, a navigation device, a computer, a hand-held personal communication systems (PCS) unit, a portable data unit, and a fixed location data unit.

13. A memory device, comprising:
means for pre-charging comprising a first section and a second section, the first section configured to be precharged to a first voltage, and the second section configured to be recharged to a second voltage different from the first voltage; and
means for sharing charge between the first section and the second section by coupling and decoupling the first section to the second section, the charge sharing means being selectively coupled to the first section and the second section.

14. The memory device of claim 13, integrated into at least one of a mobile phone, a set top box, a music player, a video player, an entertainment unit, a navigation device, a computer, a hand-held personal communication systems (PCS) unit, a portable data unit, and a fixed location data unit.

* * * * *